(12) United States Patent
Yang et al.

(10) Patent No.: US 12,453,297 B2
(45) Date of Patent: Oct. 21, 2025

(54) RECESSED LOCAL INTERCONNECT SEMICONDUCTOR MEMORY DEVICE

(71) Applicant: International Business Machines Corporation, Armonk, NY (US)

(72) Inventors: Chih-Chao Yang, Glenmont, NY (US); Theodorus E. Standaert, Clifton Park, NY (US); Daniel Charles Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 797 days.

(21) Appl. No.: 17/550,200

(22) Filed: Dec. 14, 2021

(65) Prior Publication Data
US 2023/0189671 A1     Jun. 15, 2023

(51) Int. Cl.
*H10N 70/00* (2023.01)
*H10B 53/30* (2023.01)
*H10B 61/00* (2023.01)
*H10B 63/00* (2023.01)
*H10N 50/01* (2023.01)
*H10N 50/80* (2023.01)

(52) U.S. Cl.
CPC ........... *H10N 70/841* (2023.02); *H10B 53/30* (2023.02); *H10B 61/00* (2023.02); *H10B 63/80* (2023.02); *H10N 50/01* (2023.02); *H10N 50/80* (2023.02); *H10N 70/063* (2023.02); *H10N 70/826* (2023.02)

(58) Field of Classification Search
CPC ... H10N 70/841; H10N 70/801; H10N 70/063
See application file for complete search history.

(56) References Cited

U.S. PATENT DOCUMENTS

| | | |
|---|---|---|
| 7,184,853 B2 | 2/2007 | Roberts |
| 7,223,612 B2 | 5/2007 | Sarma |
| 7,315,071 B2 | 1/2008 | Boivin |
| 7,419,882 B2 | 9/2008 | Wu |
| 7,442,624 B2 | 10/2008 | Sarma |
| 7,545,740 B2 | 6/2009 | Zelig |
| 7,674,717 B2 | 3/2010 | Wang |
| 7,678,659 B2 | 3/2010 | Tu |
| 8,865,481 B2 | 10/2014 | Li |
| 10,319,783 B2 | 6/2019 | Briggs |
| 10,497,861 B2 | 12/2019 | Chuang |
| 2016/0351806 A1* | 12/2016 | Hsieh ................... H10N 70/068 |
| 2019/0341543 A1 | 11/2019 | Liao |
| 2020/0052207 A1* | 2/2020 | Ando ..................... H10B 63/30 |
| 2020/0274067 A1* | 8/2020 | Miyazoe ............. H10N 70/841 |

\* cited by examiner

*Primary Examiner* — Shih Tsun A Chou
(74) *Attorney, Agent, or Firm* — Aaron N. Pontikos

(57) ABSTRACT

A semiconductor device and formation thereof. The semiconductor device includes a memory device located on top of a first bottom interconnect, wherein the first bottom interconnect is embedded in a first dielectric layer. The semiconductor device further includes a second bottom interconnect embedded in the first dielectric layer, wherein the second bottom interconnect is adjacent to the first bottom interconnect. A top surface of the second bottom interconnect is recessed relative to a top surface of the first bottom interconnect.

9 Claims, 10 Drawing Sheets

RECESSED LOCAL INTERCONNECT SEMICONDUCTOR MEMORY DEVICE

BACKGROUND OF THE INVENTION

The present invention relates generally to the field of semiconductor devices, and more particularly to semiconductor memory devices having recessed local interconnects.

As integrated circuits move to smaller technology nodes, the ability to limit or eliminate damage to local interconnects during memory stack patterning has become increasingly challenging. Some of the main process challenges during memory stack patterning include dielectric and insulator damage of electrical interconnects, which can lead to high resistive-capacitive (RC) delays, and metal liner damage of electrical interconnects, which can lead to electromigration.

SUMMARY

According to one embodiment of the present invention, a semiconductor device is provided. The semiconductor device includes a memory device located on top of a first bottom interconnect, wherein the first bottom interconnect is embedded in a first dielectric layer. The semiconductor device further includes a second bottom interconnect embedded in the first dielectric layer, wherein the second bottom interconnect is adjacent to the first bottom interconnect. A top surface of the second bottom interconnect is recessed relative to a top surface of the first bottom interconnect.

According to another embodiment of the present invention, a method of forming a semiconductor device is disclosed. The method includes forming a first bottom interconnect and a second bottom interconnect in a dielectric layer, wherein the first bottom interconnect is adjacent to the second bottom interconnect. A top surface of the second bottom interconnect is recessed relative to top surface of the first bottom interconnect.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which:

When viewed as ordered combinations, FIGS. 3-18 illustrate both (i) semiconductor memory devices and (ii) the methods for forming such semiconductor memory devices, in accordance with illustrative embodiments.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Embodiments of the present invention provide for a semiconductor memory device having recessed local interconnects and methods of forming a semiconductor memory device having recessed local interconnects.

Embodiments of the present invention recognize that current methods of patterning memory stacks to form memory devices (i.e., memory device pillars) are prone to dielectric and insulator damage of adjacent local interconnects (i.e., interconnects that are adjacent to the interconnect in which the memory device is embedded onto). This can lead to high resistive-capacitive (RC) delays. Embodiments of the present invention further recognize that current methods of patterning memory stacks to form memory devices are prone to metal liner damage of adjacent local interconnects. This can lead to electromigration from the interconnect to the surrounding dielectric material.

Figure 1:
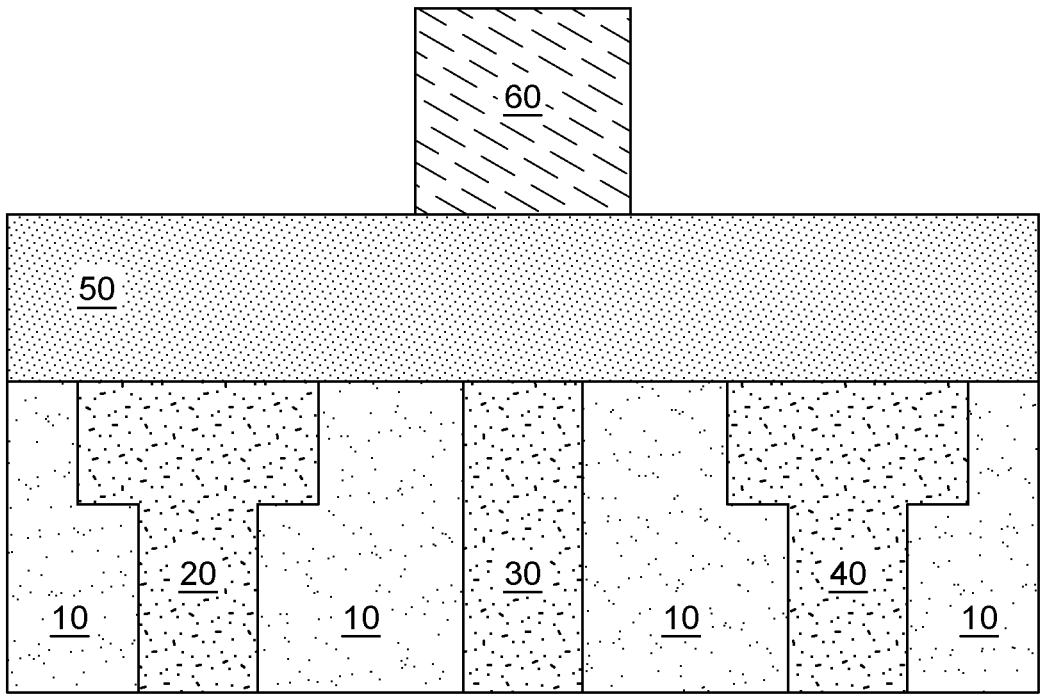
FIG. 1 illustrates a cross-sectional view of a conventional semiconductor device prior to patterning a memory stack to form a patterned memory device.

FIG. 1 illustrates a cross-sectional view of a conventional semiconductor device prior to patterning a memory stack to form a memory device. Conventional semiconductor device includes interconnects 20, 30, and 40 formed within dielectric layer 10. Interconnect 30 is a via interconnect and interconnects 20 and 40 are line/via interconnects. A memory stack layer 50 is formed on the surfaces of interconnects 20-40. A patterned hard mask 60 is subsequently formed on a portion of the surface of memory stack layer 50 and above interconnect 30.

Figure 2:
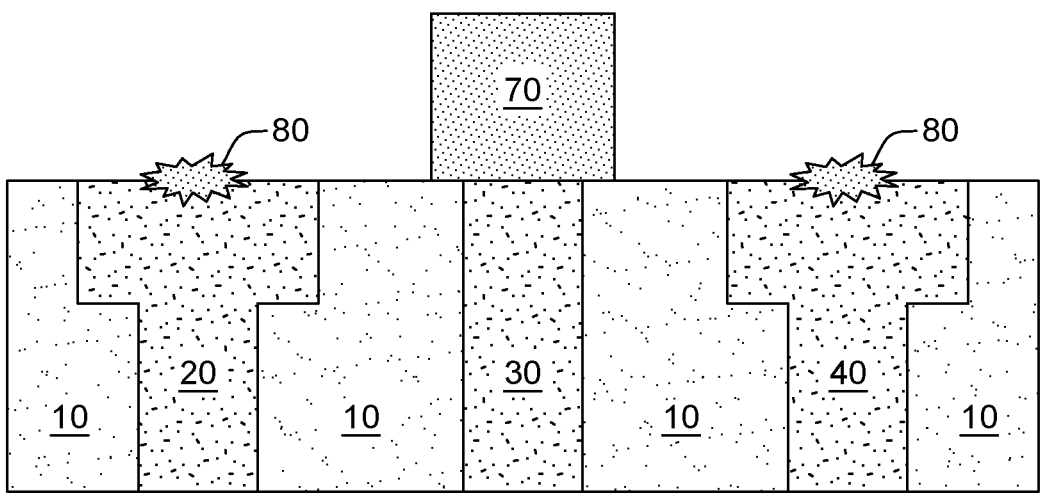
FIG. 2 illustrates a cross-sectional view of the conventional semiconductor device of FIG. 1 after patterning the memory stack to from the patterned memory device.

FIG. 2 illustrates a cross-sectional view of the conventional semiconductor device of FIG. 1 after patterning the memory stack layer 50 to form a memory device 70 embedded on interconnect 30. Memory device 70 is formed by material removal of exposed portions of memory stack layer 50 adjacent to patterned hard mask 60. For example, the exposed portions of memory stack layer 50 are removed via an etching process. As depicted in FIG. 2, forming memory device 70 embedded on interconnect 30 has lead to the formation of a defect 80 (e.g., due to excessive etching during memory stack pattering) in the top surface of local interconnects 20 and 40, respectively, which are adjacent to local interconnect 30.

Embodiments of the present invention eliminate any damage to adjacent local interconnects during patterning of a memory stack layer to form a memory device by selectively recessing a top portion of the adjacent local interconnects, filling the recessed portion of the adjacent local interconnects with an insulator, and forming a memory device embedded on a central interconnect thereafter. Thus, the insulator material formed within the recessed portions of the adjacent local interconnects protects the adjacent local interconnect material from any defects resulting from excessive etching during patterning of the memory stack layer to form a memory device.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below, in conjunction with FIGS. 3-18, embodiments of the present invention include semiconductor memory devices and methods of forming such semiconductor memory devices, and in particular, semiconductor memory devices having adjacent local interconnects formed from a bottom metal layer and a top insulator layer. The methods described below in conjunction with FIGS. 3-18 may be incorporated into typical semiconductor memory device fabrication processes, such as fabrication processes. As such, when viewed as ordered combinations, FIGS. 3-18 illustrate methods for forming semiconductor memory devices having recessed adjacent local interconnects filled with an insulator material in order to eliminate defects in the metal layer of adjacent local interconnects when forming a memory device embedded on a centrally located interconnect, and thus improved semiconductor memory devices that are devoid of local interconnect defects in accordance with illustrative embodiments of the present invention.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, terms such as "depositing," "forming," and the like may refer to the disposition of layers, or portions of materials, in accordance with a given embodiment. Such processes may or may not be different than those used in the standard practice of the art of microcooler device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, electroplating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, micromachining, microetching, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

The present invention will now be described in detail with reference to the Figures. FIGS. 3-18 include various cross-sectional views depicting illustrative steps of a method for manufacturing semiconductor devices and the resulting semiconductor devices according to select embodiments of the present invention. One having ordinary skill in the art will appreciate that there are many options available for the formation of the structures described herein and that the following discussion does not limit embodiments to only the techniques described herein.

Figure 3:
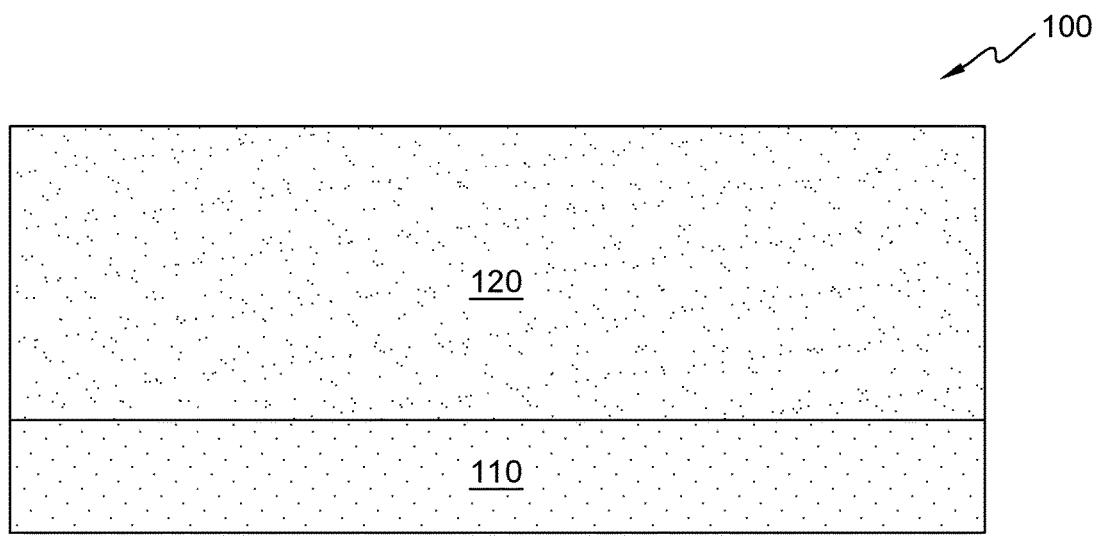
FIG. 3 illustrates a cross-sectional view depicting formation of a dielectric layer 120 on top of a substrate 110, generally designated 100, in accordance with at least one embodiment of the present invention.

Referring now to FIG. 3, FIG. 3 illustrates a cross-sectional view of an initial semiconductor structure, generally designated 100, that includes a dielectric layer 120 formed on a substrate 110. In some embodiments, substrate 110 may include a front-end-of-the-line (FEOL) level. A FEOL level is typically present beneath the lowest level of the multilayered interconnect structure and includes a semiconductor substrate having one or more semiconductor devices such as, for example, transistors, capacitors, resistors, and etc. located thereon. In other embodiments, substrate 110 may include one or more interconnect levels of a multilayered interconnect structure. In such an embodiment, each interconnect level may include one or more electrically conductive structures embedded in an interconnect dielectric material. For example, the one or more interconnect levels of a multilayered interconnect structure may be formed from any generally known semiconductor materials, such as silicon, gallium arsenide, or germanium.

Dielectric layer 120 may be composed of an inorganic dielectric material or an organic dielectric material. In some embodiments, dielectric layer 120 may be porous. In other embodiments, dielectric layer 120 may be non-porous. In some embodiments, dielectric layer 120 may have a dielectric constant (all dielectric constants mentioned herein are measured relative to a vacuum, unless otherwise stated) that is about 4.0 or less. In an embodiment, dielectric layer 120 may have a dielectric constant of 2.8 or less. These dielectrics having a dielectric constant of 2.8 or less generally have a lower parasitic cross talk as compared to dielectric materials whose dielectric constant is greater than 4.0. Examples of suitable dielectric materials that may be employed as dielectric layer 120 include, but are limited to, porous silicates, silicon dioxides, silicon oxynitrides, silicon carbides, silicon nitrides, silicon undoped or doped silicate glass, silsesquioxanes, carbon doped oxides (i.e., organosilicates) that include atoms of Si, C, O and H, and variants thereof, siloxanes, thermosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

Dielectric layer 120 can be deposited on substrate 110 using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), liquid source misted chemical deposition (LSMCD), spin-on coating, sputtering, and/or plating. Dielectric layer 120 can have a thickness from 50 nm to 250 nm. However, other thicknesses that are less than 50 nm, and greater than 250 nm can also be employed in embodiments of the present invention.

Figure 4:
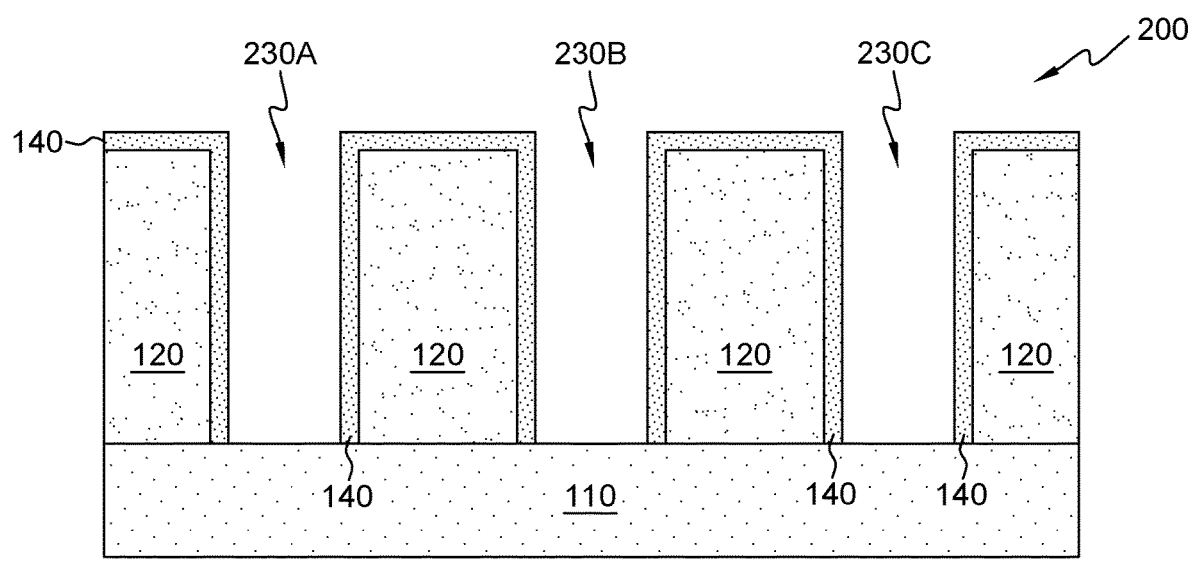
FIG. 4 illustrates a cross-sectional view of the structure 100 depicted in FIG. 3 after subsequent processing steps, generally designated 200, in accordance with at least one embodiment of the present invention.

FIG. 4 illustrates a cross-sectional view of semiconductor structure 100 depicted in FIG. 3 after performing subsequent processing steps, generally designated 200, in accordance with at least one embodiment of the present invention. The semiconductor structure 200 depicted in FIG. 4 is obtained following the patterning of dielectric layer 120. At an initial fabrication stage, openings 230A-230C are conventionally formed in dielectric layer 120 by using, for example, known damascene techniques. As an example, photoresist material (not depicted) is deposited onto dielectric layer 120. The photoresist can be applied by any suitable techniques, including, but not limited to, coating or spin-on techniques. A dielectric mask (not depicted), is formed over the photoresist material, followed by etching steps. The dielectric mask is patterned with shapes defining openings 230A-230C to be formed, and the dielectric mask pattern is transferred to the photoresist material using a lithographic process, which creates recesses in the uncovered regions of the photoresist material. The resulting patterned photoresist material is subsequently used to create the same pattern of openings 230A-230C in dielectric layer 120. Dry etch techniques (for example, an anisotropic etch process, such as reactive ion etch) may be employed to selectively remove portions of dielectric layer 120 to form openings 230A-230C extending vertically downwardly through dielectric layer 120 and towards substrate 110. The depth(s) of openings 230A-230C can be controlled by using a timed etching process. After formation of openings 230A-230C, the photoresist may be stripped from dielectric layer 120 by ashing or other suitable processes. The resulting structure may be subjected to a wet clean.

As depicted in FIG. 4, openings 230A-230C are vias. In some embodiments, and as shown, openings 230A-230C extend through the entire depth of dielectric layer 120 and have the same depth. In other embodiments, openings 230A-230C may extend partially through dielectric layer 120. In various embodiments, openings 230A-230C may have the same depth, or openings 230A-230C may have different depths.

Figure 5:
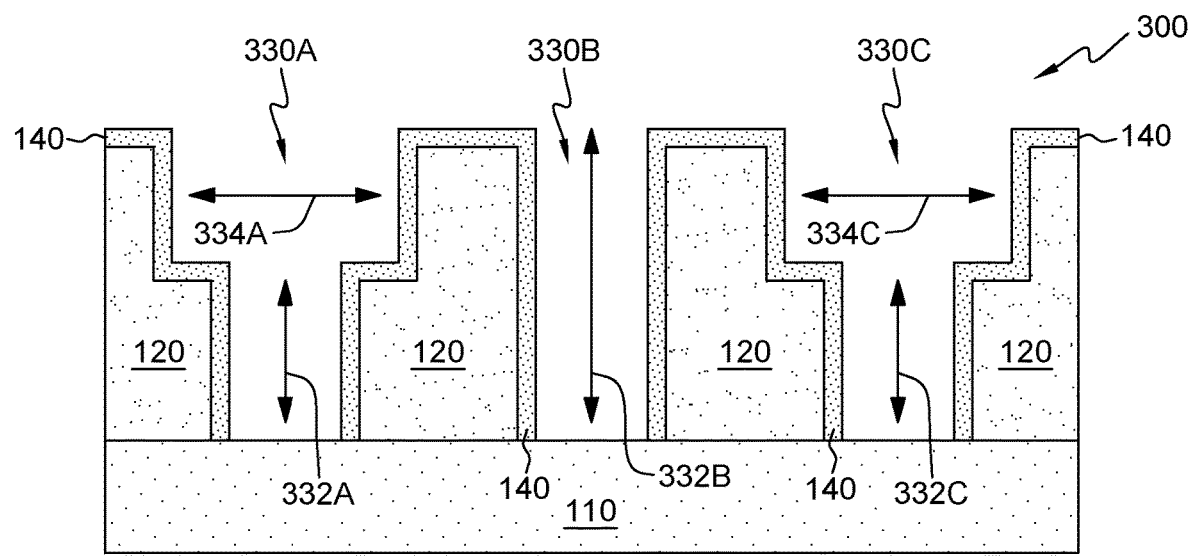
FIG. 5 illustrates a cross-sectional view of structure 100 depicted in FIG. 1 after performing alternative subsequent processing steps, generally designated 300, in accordance with at least one embodiment of the present invention.

FIG. 5 illustrates a cross-sectional view of semiconductor structure 200 depicted in FIG. 4 after performing alternative subsequent processing steps, generally designated 300, in accordance with at least one embodiment of the present invention. The semiconductor structure 300 depicted in FIG. 5 is obtained by forming openings 330A-330C in dielectric layer 120. Opening 330B in dielectric layer 120 is formed by the same processing steps as described above with reference to FIG. 4. Openings 330A and 330C are obtained following a second iteration of lithography and etching as described above with reference to FIG. 4. For example, a photoresist material is deposited onto dielectric layer 120 as depicted in FIG. 4. A patterning stack (not depicted), including a lithographic mask is formed over the photoresist, following by etching steps. The dielectric mask is patterned with the shapes of lines (i.e., trenches) 334A and 334C to be formed, and the mask pattern is transferred to the photoresist material using a lithographic process, which creates recesses in the uncovered regions of the photoresist material. The resulting patterned photoresist material is subsequently used to create the same pattern of lines 334A and 334C in dielectric layer 120. Dry etch techniques (for example, an anisotropic etch process, such as reactive ion etch) may be employed to selectively remove portions of dielectric layer 120 to form lines 334A and 334C in a top selected portion of dielectric layer 120. The depth(s) of lines 334A and 334C can be controlled by using a timed etching process. The bottom portions of lines 334C and 334C adjoin the top openings of vias 332A and 332C, respectively. The depth(s) of lines 334A and 334C can be controlled by using a timed etching process. After formation of openings 330A-330C, the photoresist may be stripped from dielectric layer 120 by ashing or other suitable processes. The resulting structure may be subjected to a wet clean.

As depicted in FIG. 5, openings 330A and 330C are line/vias (i.e., trench/vias) and opening 330B is a via (as designated by arrow 332B). In an embodiment, and as shown, openings 330A-330C extend through the entire depth of dielectric layer 120 and have the same depth. In other embodiments, openings 330A-330C may extend partially through dielectric layer 120. In various embodiments, openings 330A-330C may have the same depth, or openings 330A-330C may have different depths.

In some embodiments, and as depicted in FIGS. 4 and 5, an optional metal liner 140 is conformally deposited on the exposed surfaces of the patterned dielectric layer 120. Metal liner 140 may include one or more thin layers of material such as, for example, tantalum (Ta), tantalum nitride (TaN), titanium nitride (TiN), cobalt (Co), ruthenium (Ru), tungsten (W), tungsten nitride (WN), titanium-tungsten (TiW), tungsten nitride (WN) manganese (Mn), manganese nitride (MnN) or other liner materials (or combinations of liner materials) such as RuTaN, Ta/TaN, CoWP, NiMoP, NiMoB which are suitable for the given application. The thin metal liner serves as a barrier diffusion layer and adhesion layer. A conformal layer of metal liner 140 may be deposited using known techniques including, but not limited to, chemical vapor deposition (CVD), plasma enhanced chemical vapor deposition (PECVD), atomic layer deposition (ALD), physical vapor deposition (PVD), sputtering, chemical solution deposition or plating. The thickness of metal liner 140 may vary depending on the deposition process used, as well as the material employed. In some embodiments, metal liner 140 may have a thickness from 2 nm to 50 nm. However, other thicknesses that are less than 2 nm, and greater than 50 nm can also be employed in embodiments of the present invention, as long as metal liner 140 does not entirely fill openings 230A-230C or 330A-330C.

In some embodiments, an optional plating seed layer (not depicted) can be formed on metal liner 140 as well. The optional plating seed layer is employed to selectively promote subsequent electroplating of a pre-selected conductive metal or metal alloy. The optional plating seed layer may be composed of Cu, a Cu alloy, Jr, an Jr alloy, Ru, a Ru alloy (e.g., TaRu alloy) or any other suitable noble metal or noble metal alloy having a low metal-plating overpotential. Typically, a Cu or Cu alloy plating seed layer is employed when a Cu metal is to be subsequently formed within openings 230A-230C and 330A-330C. The optional plating seed layer can be formed by a conventional deposition process including, for example, CVD, PECVD, ALD, or PVD. The thickness of the optional plating seed layer may vary depending on the material of the optional plating seed layer, as well as the technique used in forming the same. Typically, the optional plating seed layer may have a thickness from 2 nm to 80 nm. However, other thicknesses that are less than 2 nm, and greater than 80 nm can also be employed in embodiments of the present invention, as long as the optional plating seed layer does not entirely fill openings 230A-230C or 330A-330C.

Figure 6:
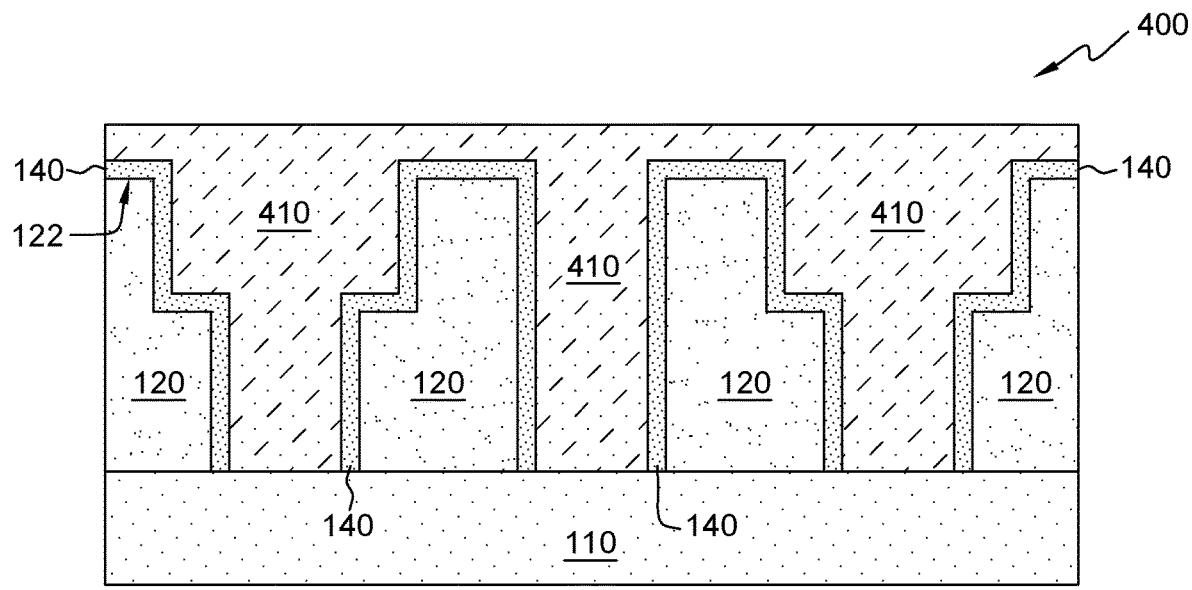
FIG. 6 illustrates a cross-sectional view of the structure 300 depicted in FIG. 5 after subsequent processing steps, generally designated 400, in accordance with at least one embodiment of the present invention.

FIG. 6 illustrates a cross-sectional view of semiconductor structure 300 depicted in FIG. 5 after performing subsequent processing steps, generally designated 400, in accordance with at least one embodiment of the present invention. It should be noted that although the subsequent processing steps as described with reference to FIGS. 6-18 are directed towards semiconductor structure 300 of FIG. 5, embodiments of the present invention can be practiced such that the same processing steps as depicted with reference to FIGS. 6-18 can be applied to semiconductor structure 200 of FIG. 4.

The semiconductor structure 400 depicted in FIG. 6 is obtained by depositing a metal filler 410 (e.g., via atomic layer deposition, chemical vapor deposition, plating, electroplating, or any other suitable deposition techniques) on the exposed surfaces of metal liner 140. Specifically, metal filler 410 is formed such that openings 330A-330C are filled with metal filler 410 until metal filler 410 is at least substantially coplanar with a top surface 122 of dielectric layer 120. In an embodiment, metal filler 410 can include, but is not limited to, copper (Cu), aluminum (Al), ruthenium (Ru), rhodium (Rh), iridium (Jr), tungsten (W), molybdenum (Mo), or any metal materials. In those embodiments in which metal liner 140 is not used, metal filler 410 is deposited directly onto the exposed surfaces of dielectric layer 120.

In an embodiment, metal filler 410 is formed within and filling openings 330A-330C by depositing metal filler 410, followed by a thermal annealing. For example, the thermal annealing can be a furnace anneal, rapid thermal anneal, flash anneal, or laser anneal. In an embodiment, for furnace anneal and rapid thermal anneal, the annealing temperature can range from 150° C. to 450° C. for furnace anneal and rapid thermal anneal and the anneal duration can range from 10 minutes to one hour. In an embodiment, for flash anneal/laser anneal, the annealing temperature can be higher (e.g., from 450° C. to 1000° C.), but the anneal duration is much shorter (e.g., ranging from 100 nanoseconds to 100 milliseconds).

In an embodiment, metal filler 410 may be a metal or metal alloy including, but not limited to, copper (Cu), aluminum (Al), tungsten (W), cobalt (Co), ruthenium (Ru), nickel (Ni), iridium (Ir), rhodium (Rh) or an alloy thereof such as, for example, a Cu—Al alloy. Metal filler 410 can be formed utilizing a deposition process such as, for example, CVD, PECVD, sputtering, chemical solution deposition or plating. In an embodiment in which a thin conformal copper (Cu) seed layer (not depicted) is deposited over the surface of metal liner 140 using, for example, PVD, metal filler 410 is subsequently formed by electroplating of Cu to fill openings 330A-330C. In an embodiment, a bottom-up plating process is employed in forming metal filler 410.

Figure 7:
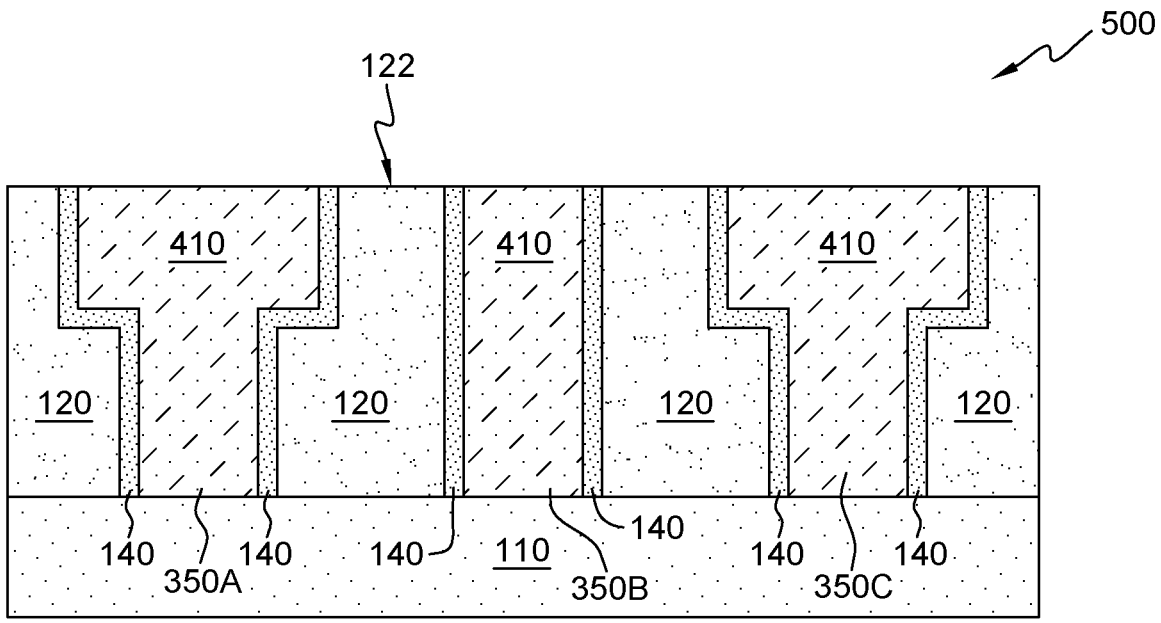
FIG. 7 illustrates a cross-sectional view of the structure 400 depicted in FIG. 6 after subsequent processing steps, generally designated 500, in accordance with at least one embodiment of the present invention.

FIG. 7 illustrates a cross-sectional view of semiconductor structure 400 depicted in FIG. 6 after performing subsequent processing steps, generally designated 500, in accordance with at least one embodiment of the present invention. The semiconductor structure 500 depicted in FIG. 7 is obtained following the deposition of metal liner 140, optional plating seed layer (not depicted), and metal filler 410, in which a planarization process such as, for example, chemical mechanical planarization or polishing (CMP) and/or grinding, is used to remove portions of metal liner 140, optional plating layer (not depicted), and metal filler 410 (collectively referred to as "overburden material") that are present outside of openings 330A-330C to form bottom interconnects 350A-350C. The planarization stops at top surface 122 of dielectric layer 120, such that metal liner 140, optional plating seed layer (not depicted), and metal filler 410 are substantially coplanar with top surface 122 of dielectric layer 120. The remaining portion of metal liner 140 that is present in openings 330A-330C may be referred to herein as a metal barrier layer, while the remaining portion of metal filler 410 that is present in openings 330A-330C may hereinafter be referred to as bottom interconnects 350A-350C. It should be appreciated that at this stage in the fabrication process, bottom interconnects 350A-350C are electrically conductive structures formed entirely from metal filler 410.

Figure 8:
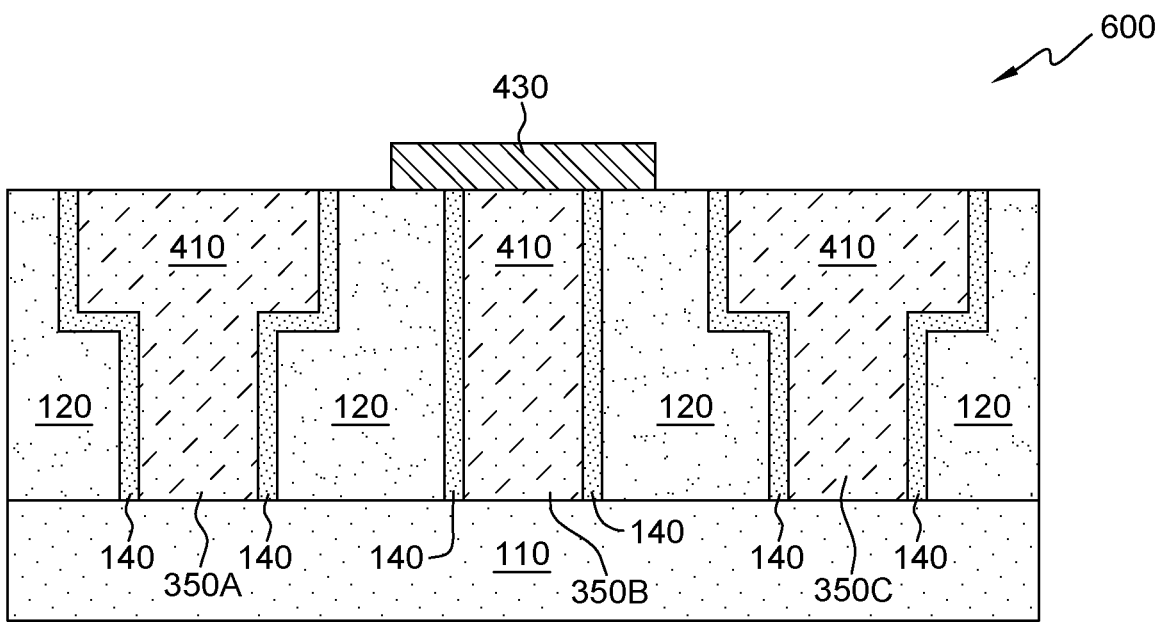
FIG. 8 illustrates a cross-sectional view of the structure 500 depicted in FIG. 7 after subsequent processing steps, generally designated 600, in accordance with at least one embodiment of the present invention.

FIG. 8 illustrates a cross-sectional view of semiconductor structure 500 depicted in FIG. 7 after performing subsequent processing steps, generally designated 600, in accordance with at least one embodiment of the present invention. The semiconductor structure 600 depicted in FIG. 8 is obtained after formation of a patterned hard mask 430. Patterned hard mask 430 protects selected regions of the underlying structure, including bottom interconnect 350B, metal liner layer 140 adjoining bottom interconnect 350B, and portions of dielectric layer 120. Other portions of the underlying structure, including bottom interconnects 350A and 330C, metal liner layer 140 adjoining bottom interconnects 350A and 350C, and portions of dielectric layer 120 are left exposed.

Patterned hard mask 430 may be formed using, for example, known damascene techniques. As an example, a hard mask layer (not depicted) is deposited onto the exposed surfaces of semiconductor structure 500 depicted in FIG. 7. A photoresist material (not depicted) is deposited onto the hard mask layer. The photoresist can be applied by any suitable techniques, including, but not limited to, coating or spin-on techniques. A dielectric mask (not depicted), is formed over the photoresist material, followed by etching steps. The dielectric mask, which is patterned with shapes defining patterned hard mask 430 to be formed, is formed on the photoresist material, and the dielectric mask pattern is transferred to the photoresist material using a lithographic process, which creates recesses in the uncovered regions of the photoresist material. The resulting patterned photoresist material is subsequently used to create the same pattern as patterned hard mask 430 in the hard mask layer. Dry etch techniques (for example, an anisotropic etch process, such as reactive ion etch) may be employed to selectively remove portions of the hard mask layer to form patterned hard mask 430. After formation of patterned hard mask 430, the photoresist material may be stripped from patterned hard mask 430 by ashing or other suitable processes. The resulting structure may be subjected to a wet clean.

Figure 9:
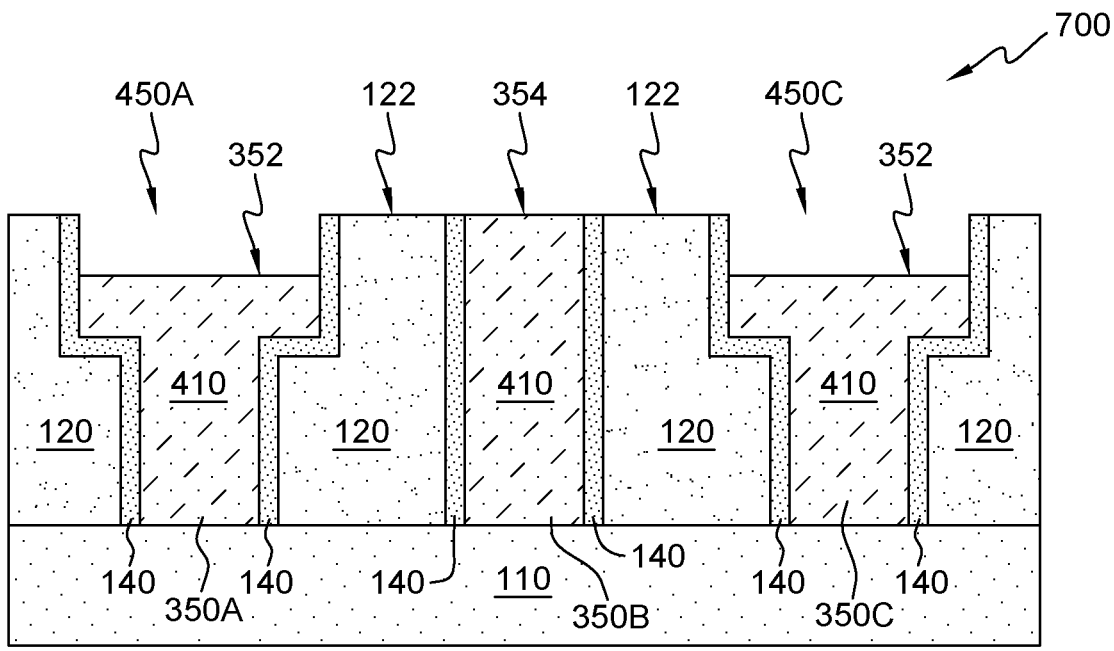
FIG. 9 illustrates a cross-sectional view of the structure 600 depicted in FIG. 8 after subsequent processing steps, generally designated 700, in accordance with at least one embodiment of the present invention.

FIG. 9 illustrates a cross-sectional view of semiconductor structure 600 depicted in FIG. 8 after performing subsequent processing steps, generally designated 700, in accordance with at least one embodiment of the present invention. As depicted by semiconductor structure 700 of FIG. 9, portions of metal filler 410 of bottom interconnects 350A and 350C are selectively removed. For example, portions of metal filler 410 are removed using an etchant that is selective to metal filler 410. This results in a top surface 352 of bottom interconnects 350A and 350C being located beneath (i.e., recessed relative to) top surface 122 of dielectric layer 120. The selective etching of metal filler 410 can be controlled by using a timed etching process.

As an example, if metal filler 410 is copper, metal filler 410 can be selectively etched using, for example, an inorganic acid solution, such as, but not limited to, an aqueous solution of $H_3PO_4$, $HNO_3$, and the like.

Recessing metal filler 410 of bottom interconnects 350A and 350C further results in the formation of openings 450A and 450C. A depth of material (i.e., metal filler 410) removed from bottom interconnects 350A and 350C can range from 5 nm to 100 nm. However, other depths of material removed that are less than 5 nm, and greater than 100 nm can also be employed in embodiments of the present invention. The depth of material removed from bottom interconnects 350A and 350C corresponds to the depth of openings 450A and 450C formed as a result of the removal thereof.

It should be noted that bottom interconnect 350B is protected by patterned hard mask 430 (depicted in FIG. 8), and thus, bottom interconnect 350B is not recessed. A top surface 354 of bottom interconnect 350B are located above top surface 352 of bottom interconnects 350A and 350C.

As further depicted in FIG. 9, after selectively removing portions of metal filler 410 from bottom interconnects 350A and 350C, patterned hard mask 430 (depicted in FIG. 8) and patterned photoresist layer (not depicted) is removed utilizing one or more material removal processes. For example, patterned hard mask 430 and patterned photoresist layer can be removed utilizing a planarization process, such as, for example, chemical mechanical polishing and/or grinding.

Figure 10:
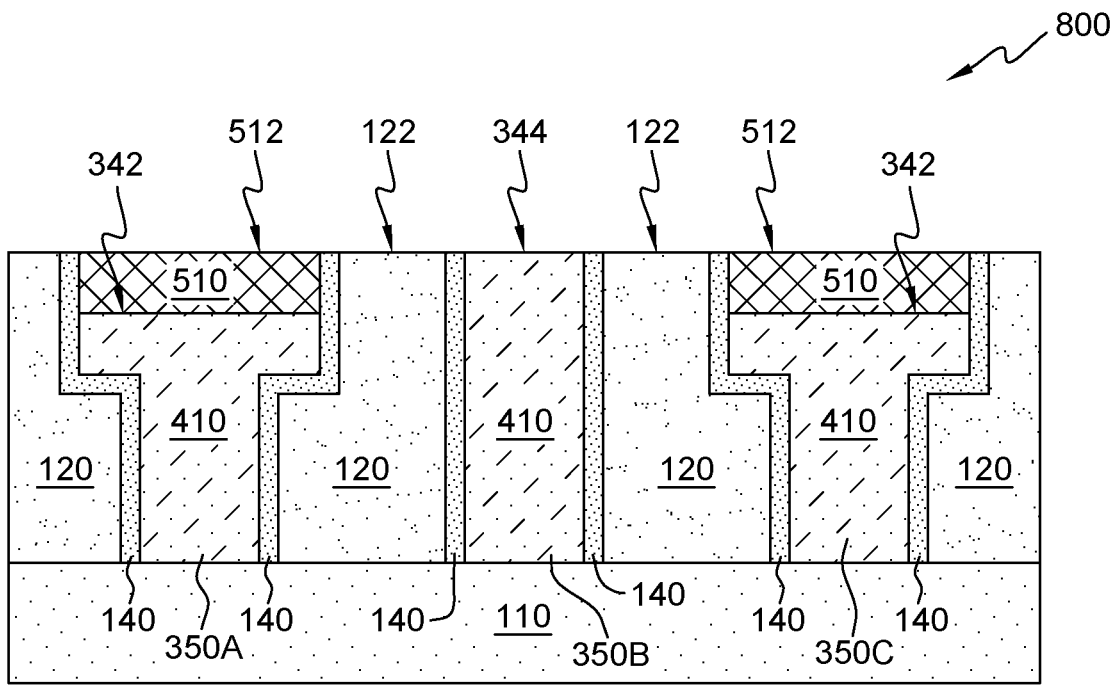
FIG. 10 illustrates a cross-sectional view of the structure 700 depicted in FIG. 9 after subsequent processing steps, generally designated 800, in accordance with at least one embodiment of the present invention.

FIG. 10 illustrates a cross-sectional view of semiconductor structure 700 depicted in FIG. 9 after subsequent processing steps, generally designated 800, in accordance with at least one embodiment of the present invention. As depicted by semiconductor structure 800 of FIG. 10, an insulator layer 510 is conformally deposited (e.g., via atomic layer deposition, chemical vapor deposition, or any other suitable deposition techniques) onto the exposed surfaces of structure 700 depicted in FIG. 9. Specifically, insulator layer 510 is formed such that openings 450A and 450C (depicted in FIG. 9) are filled with insulator layer 510 until insulator layer 510 is at least substantially coplanar with top surface 122 of dielectric layer 120. Insulator layer 510 can be deposited on the exposed surfaces of semiconductor structure 700 depicted in FIG. 9 using, for example, deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), spin-on coating, sputtering, and/or plating. Insulator layer 510 can include, but is not limited to, silicon dioxides (SiO2), silicon nitrides (Si3N4), silicon carbides (SiC), nitrogen-hydrogen doped silicon carbides (SiC)(N,H), or any other insulators which are suitable for the given application.

Following the deposition of insulator layer 510, a planarization process such as, for example, chemical mechanical planarization or polishing (CMP) and/or grinding, can be used to remove all portions of insulator layer 510 that are present outside of openings 450A and 450C (depicted in FIG. 9). The planarization stops at top surface 122 of dielectric layer 120 such that top surface 512 of insulator layer 510 formed on top surface 342 of bottom interconnects 350A and 350C, and filling openings 450A and 450C is substantially coplanar with top surface 122 of dielectric layer 120 and top surface 344 of bottom interconnect 350B.

Figure 11:
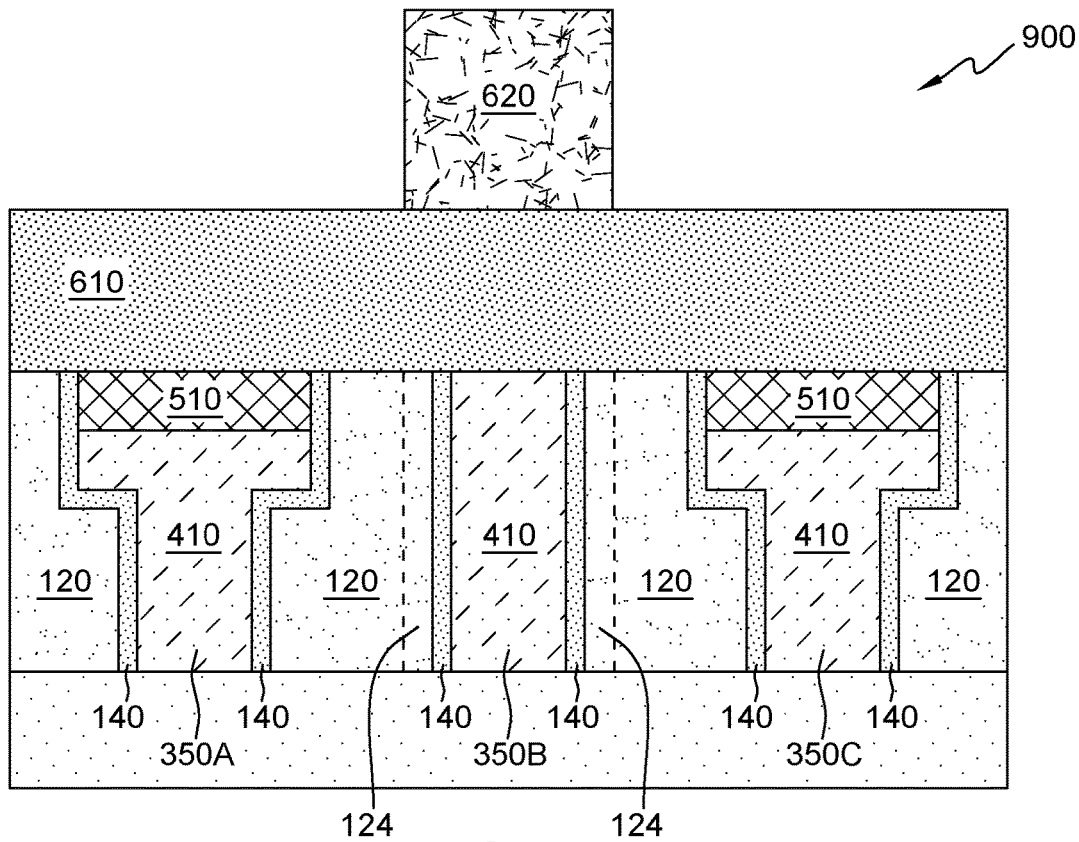
FIG. 11 illustrates a cross-sectional view of the structure 800 depicted in FIG. 10 after subsequent processing steps, generally designated 900, in accordance with at least one embodiment of the present invention.

FIG. 11 illustrates a cross-sectional view of semiconductor structure 800 depicted in FIG. 10 after subsequent processing steps, generally designated 900, in accordance with at least one embodiment of the present invention. As depicted by semiconductor structure 900 of FIG. 11, a memory stack 610 is formed on the exposed surfaces of semiconductor structure 800 depicted in FIG. 10. In some embodiments, memory stack 610 is composed of an electrically conductive metal or a metal alloy (e.g., copper (Cu), aluminum (Al), tungsten (W), cobalt (Co), ruthenium (Ru), nickel (Ni), iridium (Jr), rhodium (Rh) or an alloy thereof such as, for example, a Cu—Al alloy). In such embodiments, the electrically conductive metal or metal alloy that forms memory stack 610 may be the same as, or different from, the electrically conductive metal or metal alloy that forms bottom interconnect 350B. The electrically conductive metal or metal alloy that forms memory stack 610 may be formed utilizing one of the deposition processes used to deposit metal liner 140 or metal filler 410.

In other embodiments, memory stack 610 is composed of an electrically conductive metal-containing material stack layer which may be used as a non-volatile memory device such as, for example, a ferroelectric memory (FE) device, a resistive random access memory (ReRAM) device, a magnetoresistive random access memory (MRAM) device, or a phase change random access memory (PRAM) device.

A FE memory device is a random access memory similar in construction to a DRAM by using a ferroelectric layer instead of a dielectric layer to achieved non-volatility. FE memory devices typically include a material stack of, from bottom to top, a bottom electrode, a ferroelectric layer, and a top electrode. The bottom and top electrodes may be composed of a metal or metal nitride. For example, TiN may be used as the material for both the bottom and top electrodes. The ferroelectric layer is composed of one or more ferroelectric materials exhibiting ferroelectricity (i.e., a material that has a spontaneous electric polarization that can be reversed by the application of an external electric field). Examples of ferroelectric materials that can be used as the ferroelectric layer include, but at not limited to, mixed metal oxides such as, $BaTiO_3$, $Pb(Zr_xTi_{1-x})O_3$ ($0.1 \leq x \leq 1$), or crystalline $HfO_2$ with, or without, a doping element selected from Zr, Al, Ca, Ce, Dy, Er, Gd, Ge, La, Sc, Si, Sr, Sn, C, N, and Y. The FE material stack can be formed by deposition of the various material layers.

A ReRAM device is a random access memory that typically includes a material stack of, from bottom to top, a bottom electrode, a metal oxide that can exhibit a change in electron localization, and a top electrode. The bottom and top electrodes may be composed of a metal or metal nitride. For example, TiN may be used as the material for both the bottom and top electrodes. The metal oxide may include oxides of nickel, zirconium, hafnium, iron, or copper. The ReRAM material stack can be formed by deposition of the various material layers.

A MRAM device is a random access memory, that includes a magnetic tunnel junction (MTJ) structure The magnetic tunnel junction (MTJ) structure may include a magnetic reference layer, a tunnel barrier, and a magnetic free layer. The magnetic reference layer has a fixed magnetization. The magnetic reference layer may be composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier of the MTJ structure is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators.

The magnetic free layer of the MTJ structure is composed of at least one magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron. The MTJ structure of the MRAM device can be formed by deposition of the various material layers.

A PRAM device is a random access memory that typically includes a material stack of, from bottom to top, a bottom electrode, a phase change memory material that exhibits a change in atomic order (from crystalline to amorphous or vice versa), and a top electrode. The bottom and top electrodes may be composed of a metal or metal nitride. For example, TiN may be used as the material for both the bottom and top electrodes. The phase change memory material may include a chalcogenide glass such as, for example, $Ge_2Sb_2Te_5$ or $Ge_2Bi_2Te_6$. The PRAM stack can be formed by deposition of the various material layers.

Following the formation of memory stack 610, a patterned hard mask 620 is formed by depositing a hard mask layer (not depicted) on memory stack 610 and patterning the hard mask using a patterned photoresist layer (not depicted), followed by etching. Patterned hard mask 620 protects selected regions of the underlying structure, including bottom interconnect 350B, metal liner 140 adjoining bottom interconnect 350B, and portion 124 of dielectric layer 120 adjoining metal liner layer 140. Other portions of the underlying structure, including insulator layer 510 of bottom interconnects 350A and 350C, portions of metal layer 140 adjoining insulator layer 510 of bottom interconnects 350A and 350C, and portions of dielectric layer 120 (other than portions 124 and 126 of dielectric layer 120) are left exposed.

Patterned hard mask 620 may be composed of any metal-containing hard mask material such as, for example, titanium nitride or tantalum nitride. A hard mask layer (not depicted) may be formed utilizing a deposition process such as, for example, CVD, PECVD, ALD, physical vapor deposition (PVD) or sputtering, followed by patterning using a patterned photoresist layer (not depicted). The etching may include an anisotropic etch etching process such as, for example, reactive ion etching. The etching transfers a pattern provided by the patterned photoresist layer into the hard mask layer to form patterned hard mask 620. Patterned hard mask 620 may have a thickness from 20 nm to 150 nm.

However, other thicknesses that are less than 20 nm, and greater than 150 nm can also be employed in embodiments of the present invention. The patterned photoresist layer (not depicted) can be removed after this patterning step utilizing a resist removal process such as, for example, stripping or ashing.

Figure 12:
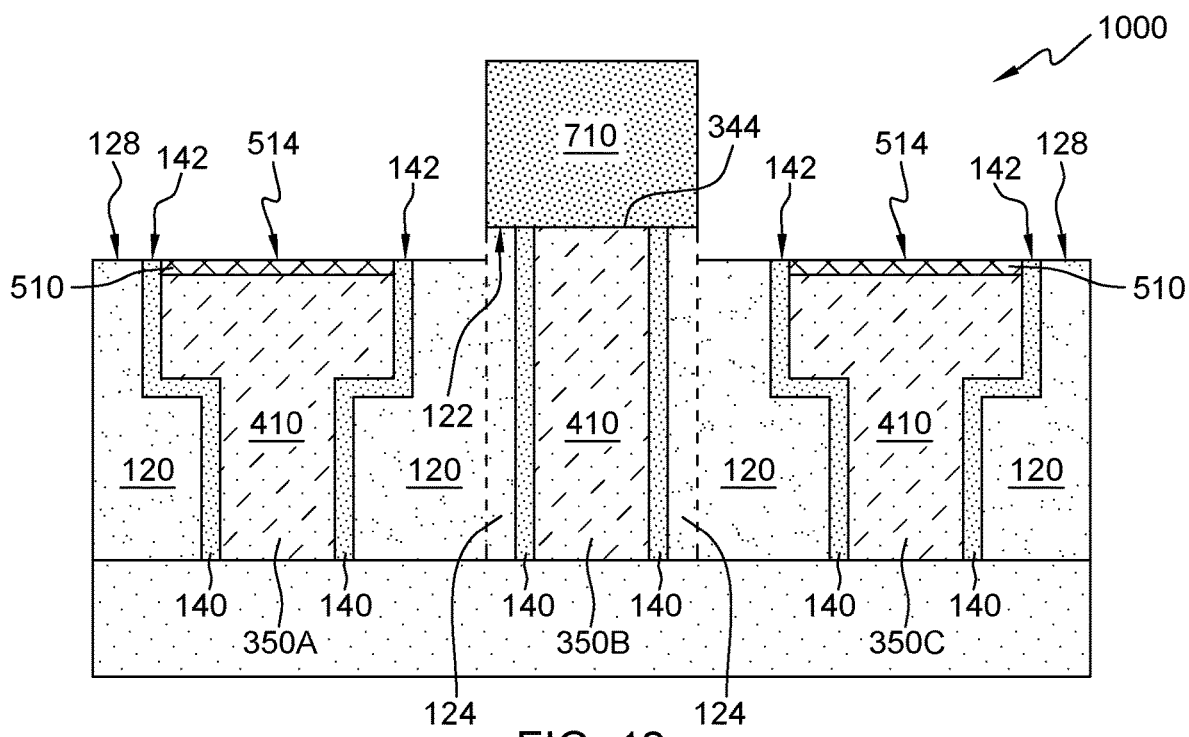
FIG. 12 illustrates a cross-sectional view of the structure 900 depicted in FIG. 11 after subsequent processing steps, generally designated 1000, in accordance with at least one embodiment of the present invention.

FIG. 12 illustrates a cross-sectional view of semiconductor structure 900 depicted in FIG. 11 after subsequent processing steps, generally designated 1000, in accordance with at least one embodiment of the present invention. As depicted by semiconductor structure 1000 of FIG. 12, a patterned memory stack 710 (also referred to herein as a memory device or memory device pillar) is formed after patterning memory stack 610 (depicted in FIG. 11) utilizing patterned hard mask 620 (depicted in FIG. 11) as an etch mask, and subsequently removing patterned hard mask 620. Patterned memory stack 710 is in direct physical contact with a top surface (i.e., contact surface) of bottom interconnect 350B. Patterned memory stack 710 can be any memory device as defined above.

During patterning of memory stack 610 to form patterned memory stack 710, the physically exposed portions of structure 900 depicted in FIG. 11, including insulator layer 510 of bottom interconnects 350A and 350C, portions of metal liner 140 adjoining insulator layer 510 of bottom interconnects 350A and 350C, and portions of dielectric layer 120 (other than portion 124 of dielectric layer (depicted in FIG. 11) may also be recessed as shown in FIG. 12. This results in a top surface 128 of dielectric layer 120 being located beneath top surface 122 of portion 124 of dielectric layer 120 located below patterned memory stack 710. Similarly, this results in a top surface 514 of insulator layer 510 being located beneath top surface 122 of portion 124 of dielectric layer 120. Likewise, this results in a top surface 142 of metal liner 140 adjoining insulator layer 510 of bottom interconnects 350A and 350C being located beneath top surface 344 of bottom interconnect 350B.

The patterning of memory stack 610 to form patterned memory stack 710 includes an anisotropic etching process such as, for example, reactive ion etching (REI) ion beam etching (IBE), chemical wet etching or a combination of ion beam etching and chemical wet etching. The etch removes portions of memory stack 610 that are not located under patterned hard mask 620. The remaining, i.e., non-etched, portion of memory stack 610 that is located under patterned hard mask 620 constitutes patterned memory stack 710.

It should be appreciated that the above mentioned etching process does not remove any portion of metal filler 410 of bottom interconnects 350A and 350C since insulator layer 510 is located within, and above metal filler 410 of bottom interconnects 350A and 350C. Accordingly, the resulting semiconductor structure 1000 does not include any defects (e.g., due to excessive etching during formation of patterned memory stack 710) formed in a top surface of metal filler 410 of bottom interconnects 350A and 350C adjacent to bottom interconnect 350B. As such, the resulting semiconductor structure 1000 is not prone to high resistive-capacitive (RC) delays and electromigration caused by the formation of defects during the memory stack patterning process.

After forming patterned memory stack 710, patterned hard mask 620 can be removed utilizing one or more material removal processes. For example, patterned hard mask 620 can be removed utilizing a planarization process such as, for example, chemical mechanical polishing and/or grinding.

Figure 13:
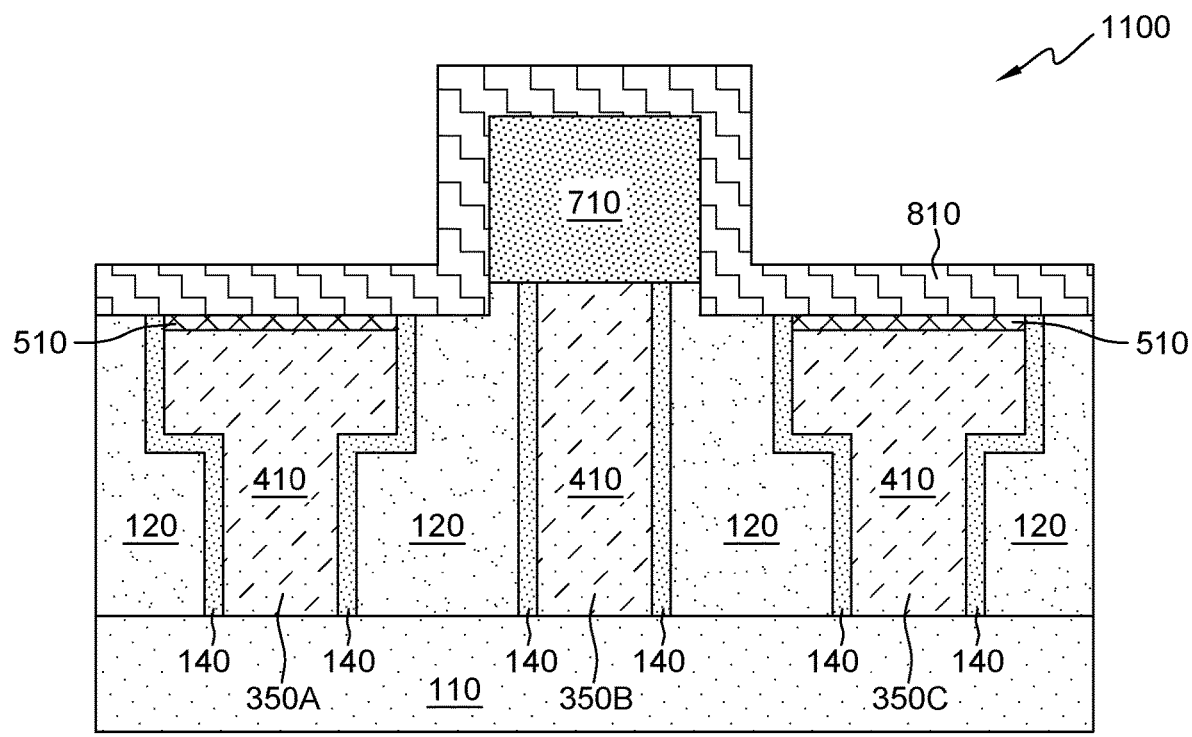
FIG. 13 illustrates a cross-sectional view of the structure 1000 depicted in FIG. 12 after subsequent processing steps, generally designated 1100, in accordance with at least one embodiment of the present invention.

FIG. 13 illustrates a cross-sectional view of semiconductor structure 1000 depicted in FIG. 12 after subsequent processing steps, generally designated 1100, in accordance with at least one embodiment of the present invention. As depicted by structure 1100 of FIG. 13, a spacer layer 810 is conformally deposited onto the exposed surfaces of semiconductor structure 1000 depicted in FIG. 12. Spacer layer 810 can be composed of any insulator material including, but not limited to, silicon dioxides (SiO2), silicon nitrides (Si3N4), silicon carbides (SiC), nitrogen-hydrogen doped silicon carbides (SiC)(N,H), or any other insulators which are suitable for the given application. Spacer layer 810 can be formed utilizing a deposition process such as, for example, chemical vapor deposition, plasma enhanced chemical vapor deposition or physical vapor deposition. Spacer layer 810 can have a thickness from 20 nm to 800 nm. However, other thicknesses that are less than 20 nm, and greater than 800 nm can also be employed in embodiments of the present invention.

Figure 14:
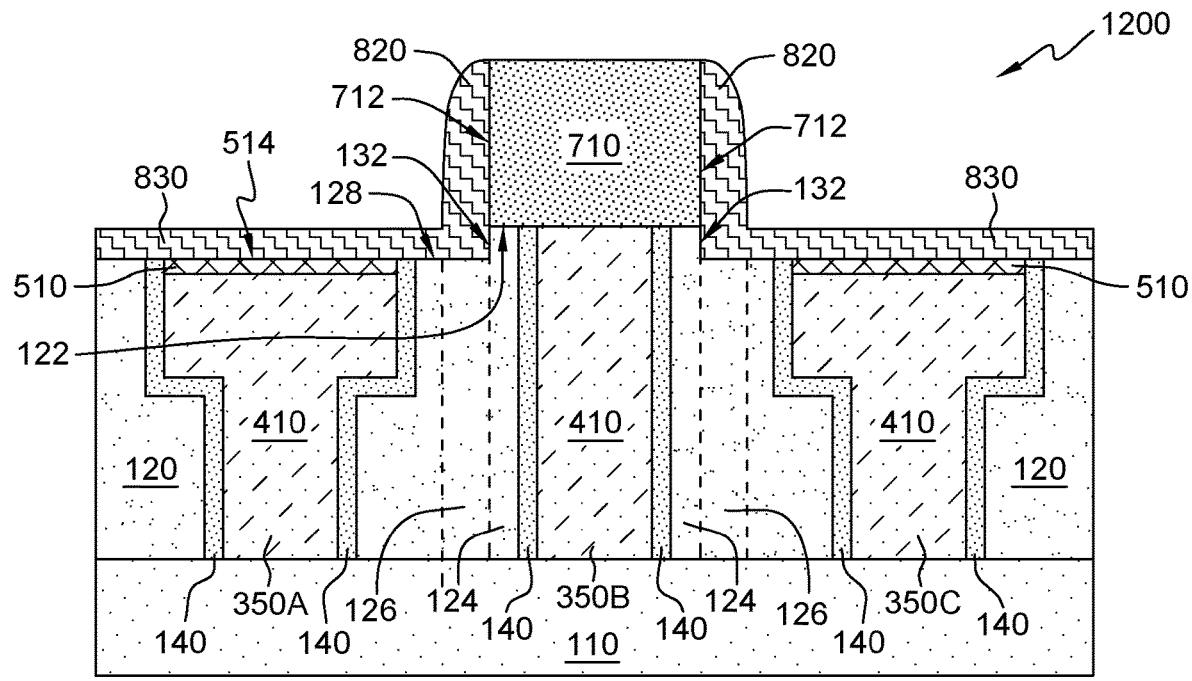
FIG. 14 illustrates a cross-sectional view of the structure 1100 depicted in FIG. 13 after subsequent processing steps, generally designated 1200, in accordance with at least one embodiment of the present invention.

FIG. 14 illustrates a cross-sectional view of semiconductor structure 1100 depicted in FIG. 13 after subsequent processing steps, generally designated 1200, in accordance with at least one embodiment of the present invention. As depicted by semiconductor structure 1200 of FIG. 14, a spacer 820 and a spacer retention layer 830 are formed after subjecting spacer layer 810 (depicted in FIG. 13) to a "partial" etch back process. In an embodiment, spacer 820 and spacer retention layer 830 are formed, for example, by at least one of directional etching (e.g., reactive ion etch (RIE)) and over etching (e.g., RIE over etch). Spacer 820 is located laterally adjacent to sidewall 712 of pattered memory stack 710 and adjacent to sidewall 132 of portion 124 of dielectric layer 120, respectively. Spacer 820 encircles patterned memory stack 710 and portion 124 of dielectric layer 120 extending between top surface 122 of dielectric layer 120 and top surface 128 of portion 126 of dielectric layer 120. Spacer 820 has a bottom surface that is located on a portion of top surface 122 of dielectric layer 120. Spacer retention layer 830 abuts a vertical portion of spacer 820 and has a bottom surface that is located on top surface 514 insulator layer 510 of bottom interconnects 350A and 350C, top surface 142 (depicted in FIG. 12) of metal liner 140 adjoining insulator layer 510 of bottom interconnects 350A and 350C, and top surface 128 of portions 126 of dielectric layer 120.

Figure 15:
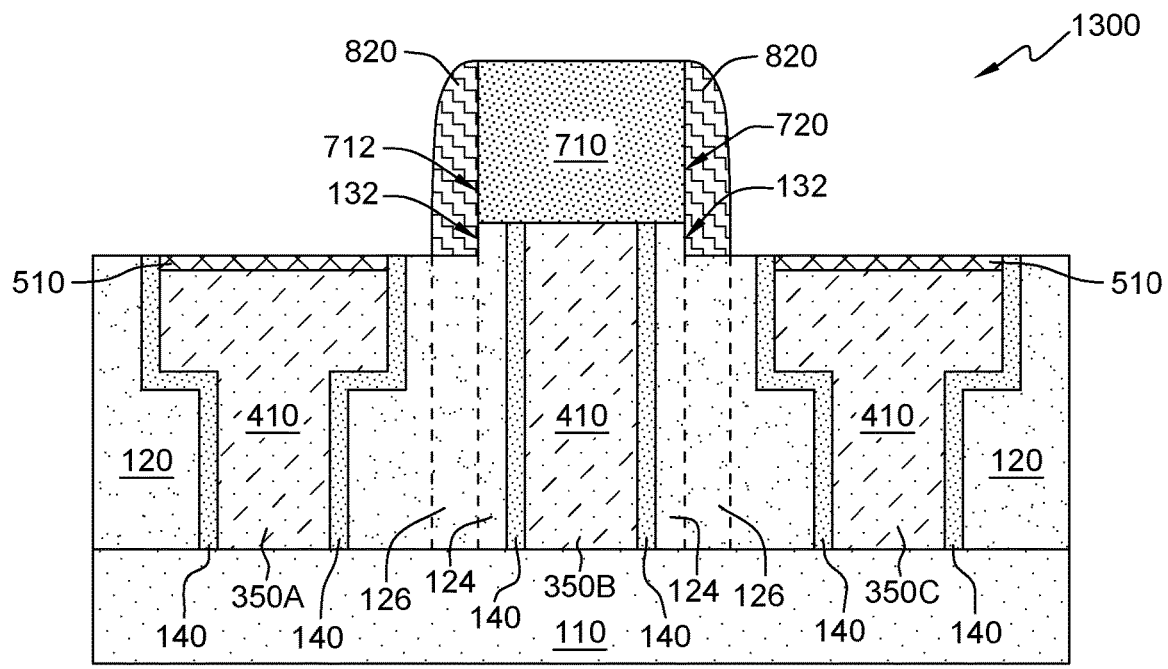
FIG. 15 illustrates a cross-sectional view of the structure 1100 depicted in FIG. 13 after alternative subsequent processing steps, generally designated 1300, in accordance with at least one embodiment of the present invention.

FIG. 15 illustrates a cross-sectional view of semiconductor structure 1100 depicted in FIG. 13 after alternative subsequent processing steps, generally designated 1300, in accordance with at least one embodiment of the present invention. As depicted by semiconductor structure 1300 of FIG. 15, spacer 820 is formed after subjecting spacer layer 810 (depicted in FIG. 13) to a "full" etch back process. The "full" etch back process results in the elimination of spacer retention layer 830 (depicted in FIG. 14). In an embodiment, spacer 820 is formed, for example, by at least one of directional etching (e.g., reactive ion etch (RIE)) and over etching (e.g., RIE over etch). Spacer 820 is located laterally adjacent to sidewall 712 of pattered memory stack 710, and adjacent to sidewall 132 of portions 124 and 126 of dielectric layer 120, respectively. Spacer 820 encircles patterned memory stack 710 and portion 124 of dielectric layer 120 extending between top surface 122 of dielectric layer 120, and top surface 128 of portion 126 of dielectric layer 120 (both depicted in FIG. 14). Spacer 820 has a bottom surface that is located on top surface 128 of portion 126 of dielectric layer 120 (depicted in FIG. 14).

Figure 16:
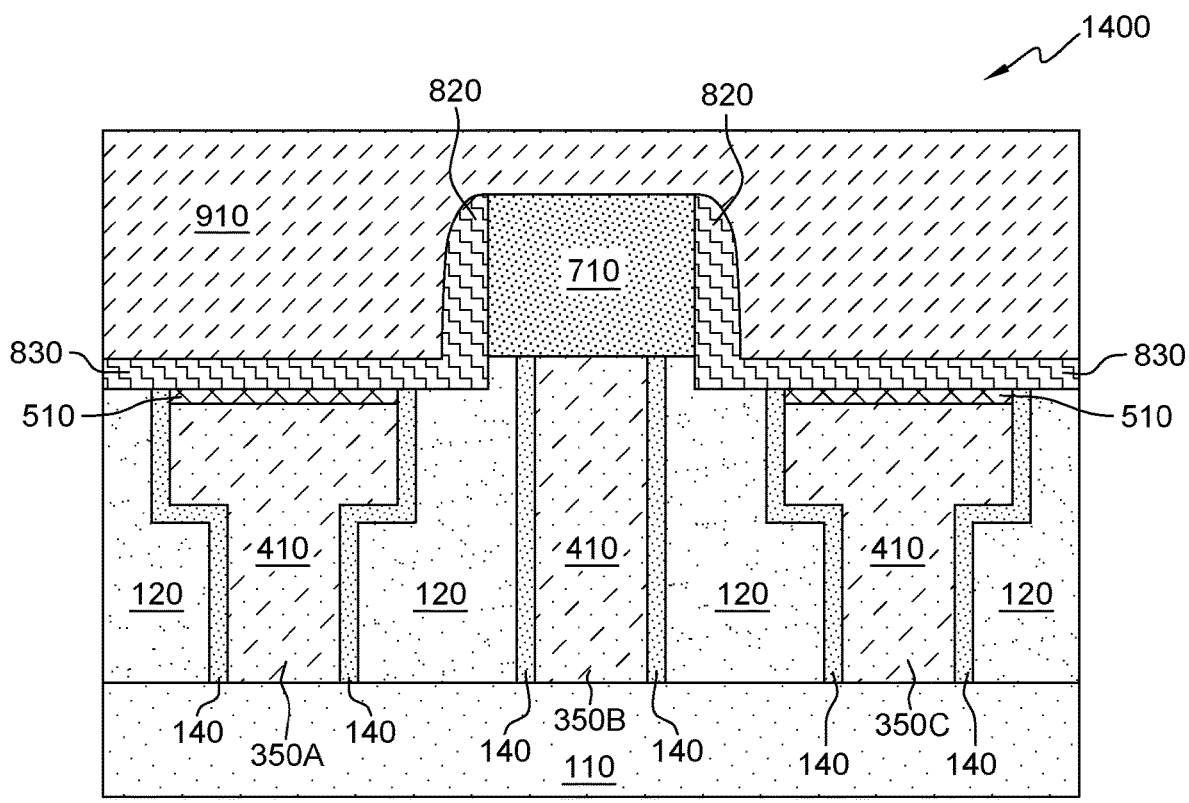
FIG. 16 illustrates a cross-sectional view of the structure 1200 depicted in FIG. 14 after alternative subsequent processing steps, generally designated 1400, in accordance with at least one embodiment of the present invention.

FIG. 16 illustrates a cross-sectional view of semiconductor structure 1200 depicted in FIG. 14 after subsequent processing steps, generally designated 1400, in accordance with at least one embodiment of the present invention. It should be noted that although the subsequent processing steps as depicted in FIGS. 16-18 are directed towards structure 1200 of FIG. 14, embodiments of the present invention can be practiced such that the same processing steps as depicted in FIGS. 16-18 can be applied to semiconductor structure 1300 of FIG. 15.

As depicted by semiconductor structure 1400 of FIG. 16, a dielectric layer 910 is conformally deposited onto the exposed surfaces of semiconductor structure 1200 depicted in FIG. 14. Dielectric layer 910 can include one of the dielectric materials mentioned above for dielectric layer 120. In some embodiments, dielectric layer 910 is composed of a same dielectric material as dielectric layer 120. In other embodiments, dielectric layer 910 is composed of a dielectric material that is compositionally different from the dielectric material used to form dielectric layer 120. Dielectric layer 910 may be formed utilizing one of the deposition processes mentioned above in forming dielectric layer 120. Dielectric layer 910 has a thickness that can be in the thickness range mentioned above for dielectric layer 120.

Figure 17:
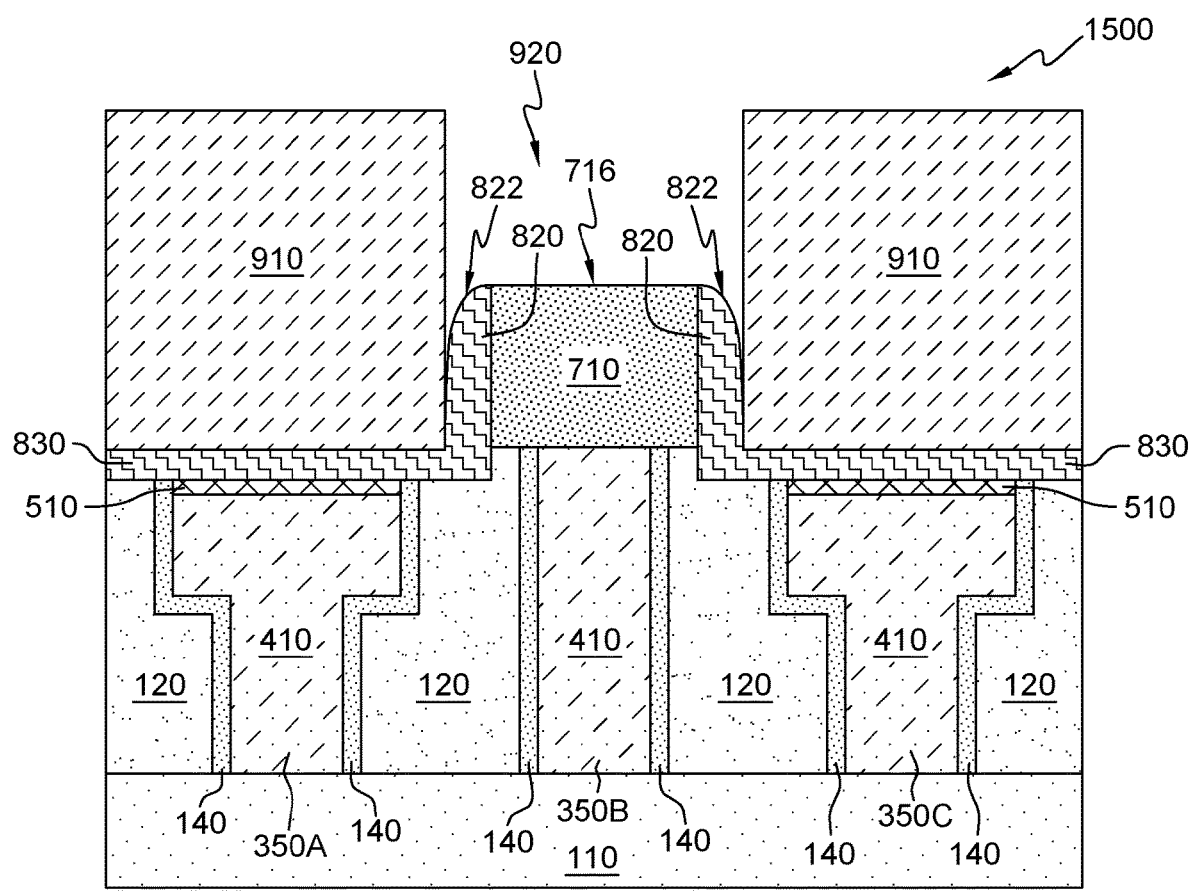
FIG. 17 illustrates a cross-sectional view of the structure 1400 depicted in FIG. 16 after subsequent processing steps, generally designated 1500, in accordance with at least one embodiment of the present invention.

FIG. 17 illustrates a cross-sectional view of semiconductor structure 1400 depicted in FIG. 16 after subsequent processing steps, generally designated 1500, in accordance with at least one embodiment of the present invention. As depicted by semiconductor structure 1500 of FIG. 17, a contact opening 920 is formed in dielectric layer 910. Contact opening 920 physically exposes at least a top surface 716 of patterned memory stack 710 and an upper portion 822 of spacer 820. In an embodiment, contact opening 920 is formed by lithography and etching. In some embodiments, a metal liner layer (not depicted), formed from a metal layer material used to form metal layer 140, as defined above, can optionally be formed onto the surface of contact opening 920 prior to filling contact opening 920 with a conductive metal or metal alloy.

Figure 18:
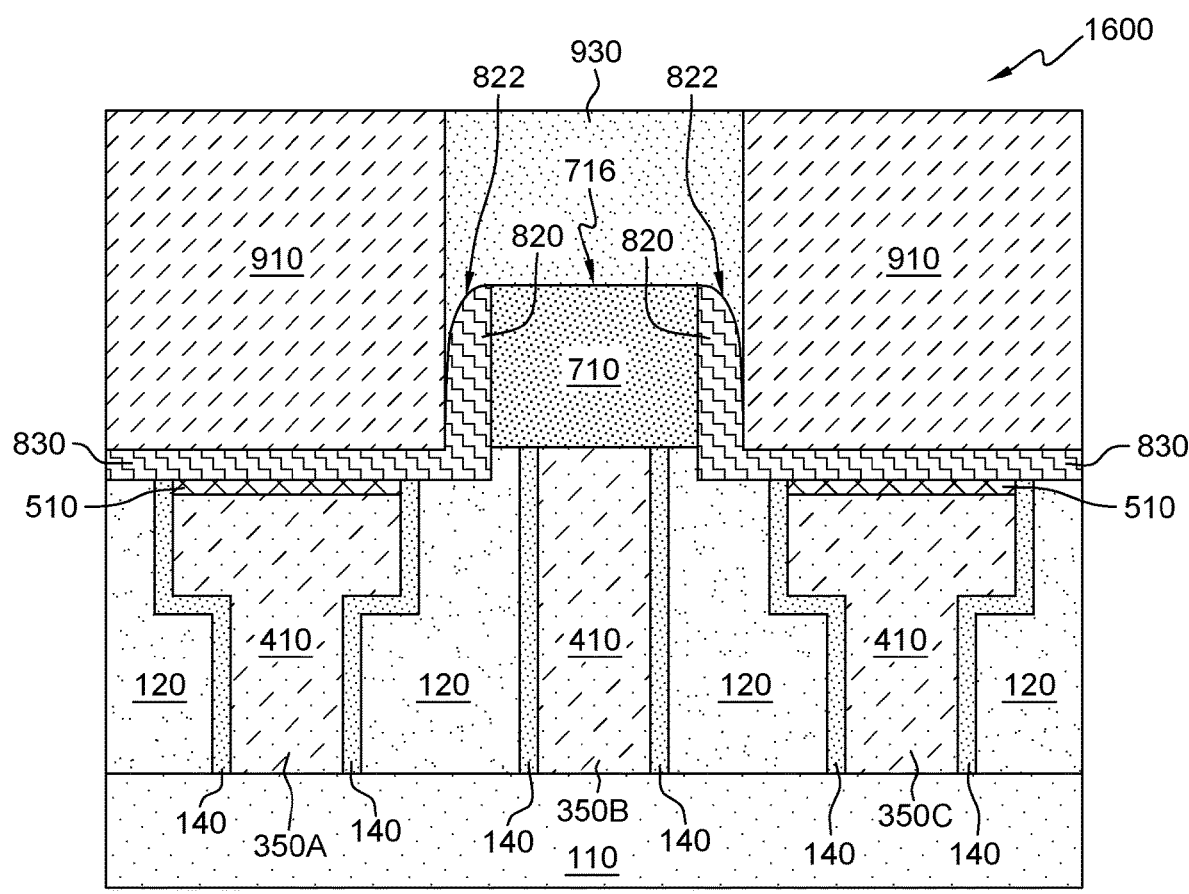
FIG. 18 illustrates a cross-sectional view of the structure 1500 depicted in FIG. 17 after alternative subsequent processing steps, generally designated 1600, in accordance with at least one embodiment of the present invention.

FIG. 18 illustrates a cross-sectional view of semiconductor structure 1500 depicted in FIG. 17 after subsequent processing steps, generally designated 1600, in accordance with at least one embodiment of the present invention. As depicted by semiconductor structure 1600 of FIG. 18, a top interconnect 930 is formed within contact opening 920 (depicted in FIG. 17). Top interconnect 930 has at least one surface that contacts patterned memory stack 710. Top interconnect 930 is in physical and electrical contact with top surface 716 of patterned memory stack 710 and at least a portion of top surface 822 of spacer 820.

Top interconnect 930 is composed of an electrically conductive material such as, for example, an electrically conductive metal, an electrically conductive metal alloy or an electrically conductive metal nitride. Examples of electrically conductive metals that can be used to form top interconnect 930 include, but are not limited to, copper (Cu), ruthenium (Ru), cobalt (Co), rhodium (Rh), tungsten (W), aluminum (Al), tantalum (Ta) or titanium (Ti). An example of electrically conductive metal alloy that can be used to form top interconnect 930 includes, but is not limited to, Cu—Al, and an example of electrically conductive metal nitride that can be used to form top interconnect 930 includes, but is not limited to, TaN or TiN. Top interconnect 930 can be composed of a single electrically conductive material or a multilayered stack of electrically conductive materials. Top interconnect 930 can be formed within contact opening 920 (depicted in FIG. 17) using one of the deposition processes mentioned above for forming metal liner layer 410 within openings 330A-330C (depicted in FIG. 5).

A planarization process, such as for example, chemical mechanical polishing and/or grinding can be used to remove any excess electrically conducive metal containing material (and if present, any excess metal liner layer) that is present outside of contact opening 920 (depicted in FIG. 17) used to form top interconnect 930, and on the topmost surface of dielectric layer 910. Following the planarization process, a top surface of top interconnect 930 is substantially coplanar with a top surface of dielectric layer 910.

According to one embodiment of the present invention, a method of forming a semiconductor device is provided, the method comprising: forming a first bottom interconnect and a second bottom interconnect in a dielectric layer, wherein: the first bottom interconnect is adjacent to the second bottom interconnect, and a top surface of the second bottom interconnect is recessed relative to a top surface of the first bottom interconnect.

In an embodiment, forming the first bottom interconnect and the second bottom interconnect in the dielectric layer according to paragraph [0086] includes: forming a first opening and a second opening in the dielectric layer corresponding to the first bottom interconnect and second bottom interconnect, respectively; and filling the first opening and the second opening with a metal.

In an embodiment, forming the second bottom interconnect in the dielectric layer according to paragraph [0087] further includes: selectively recessing a top portion of the metal of the second bottom interconnect to form a recess in the second bottom interconnect; and filling the recess in the second bottom interconnect with an insulator material.

In an embodiment, the insulator material according to paragraph [0089] is at least one of a silicon dioxide, a silicon nitride, a silicon carbide, and a nitrogen-hydrogen doped silicon carbide.

In an embodiment, selectively recessing the top portion of the metal of the second bottom interconnect to form the recess in the second bottom interconnect according to paragraph [0088] further includes: forming a first hard mask on top of the first bottom interconnect; and selectively removing the metal from the top portion of the second bottom interconnect.

In an embodiment, the method according to paragraph [0088] further includes forming a memory device on top of the first bottom interconnect after filling the recess in the second bottom interconnect with the insulator material.

In an embodiment, forming the memory device on top of the first bottom interconnect according to paragraph [0091] includes: depositing a memory stack on top of the first bottom interconnect, the second bottom interconnect, and the first dielectric layer, respectively; forming a second hard mask on top of a portion of the memory stack, wherein the second hard mask is located above the first bottom interconnect and a portion of the first dielectric layer surrounding the first bottom interconnect; and removing portions of the memory stack, insulator material formed within the recess of the second bottom interconnect, and the first dielectric layer surrounding the second bottom interconnect, respectively that are not located below the second hard mask.

In an embodiment, the memory stack according to paragraph [0092] is a ferroelectric (FE) memory stack, a resistive random access memory (ReRAM) stack, a magnetoresistive random access memory (MRAM) stack, or a phase change random access memory (PRAM) stack.

In an embodiment, the method according to paragraph [0092] further includes forming an insulating spacer layer that surrounds a sidewall of the memory device.

In an embodiment, the method according to paragraph [0094] further includes forming the insulating spacer layer on top of the second interconnect and the first dielectric layer, respectively.

In an embodiment, the method according to paragraph [0094] further includes: depositing a second dielectric layer on top of the memory device, and the spacer insulator layer, respectively; forming an opening in the second dielectric layer, wherein the opening in the second dielectric layer exposes a top surface of the memory device and a portion of a surface of the spacer insulator layer surrounding the memory device; and forming a top interconnect by filling the opening in the second layer with a metal material.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A semiconductor device, comprising:
  a memory device located on top of a first bottom interconnect, wherein the first bottom interconnect is embedded in a first dielectric layer; and
  a second bottom interconnect embedded in the first dielectric layer, wherein:
    the second bottom interconnect is adjacent to the first bottom interconnect,
    a bottom portion of the second bottom interconnect is formed from a metal material,
    a top portion of the second bottom interconnect is formed from an insulator material, and
    a top surface of the second bottom interconnect is recessed relative to a top surface of the first bottom interconnect.

2. The semiconductor device of claim 1, wherein the first bottom interconnect is formed as a via structure, and the second bottom interconnect is formed as a via structure.

3. The semiconductor device of claim 1, wherein the first bottom interconnect is formed as a via structure, and the second bottom interconnect is formed as a trench and via structure.

4. The semiconductor device of claim 1, wherein the first bottom interconnect is formed from the metal material.

5. The semiconductor device of claim 1, wherein the top portion of the second bottom interconnect formed from the insulator material is substantially coplanar with the top surface of the second bottom interconnect.

6. The semiconductor device of claim 1, wherein the insulator material is at least one of a silicon dioxide, a silicon nitride, a silicon carbide, and a nitrogen-hydrogen doped silicon carbide.

7. The semiconductor device of claim 1, further comprising an insulating spacer layer surrounding a sidewall of the memory device.

8. The semiconductor device of claim 7, wherein the insulating spacer layer is further located on the top surface of the first dielectric layer, and on the top surface of the insulating material of the second bottom interconnect.

9. The semiconductor device of claim 7, further comprising a top interconnect formed on at least a top surface of the memory device, and at least a portion of the insulating spacer layer surrounding the sidewall of the memory device.

* * * * *